(12) United States Patent
Beran et al.

(10) Patent No.: US 11,662,400 B2
(45) Date of Patent: May 30, 2023

(54) HALL SENSOR WITH HALL ELEMENTS MEASURING MAGNETIC FIELD COMPONENTS PERPENDICULARLY TO THE SUBSTRATE SURFACE

(71) Applicant: Fraunhofer-Gesellschaft zur Foerderung der angewandten Forschung e.V., Munich (DE)

(72) Inventors: Philip Beran, Erlangen (DE); Markus Sand, Erlangen (DE); Markus Stahl-Offergeld, Erlangen (DE)

(73) Assignee: FRAUNHOFER-GESELLSCHAFT ZUR FOERDERUNG DER ANGEWANDTEN FORSCHUNG EV, Munich (DE)

( * ) Notice: Subject to any disclaimer, the term of this patent is extended or adjusted under 35 U.S.C. 154(b) by 0 days.

(21) Appl. No.: 17/443,533

(22) Filed: Jul. 27, 2021

(65) Prior Publication Data

US 2022/0043079 A1 Feb. 10, 2022

(30) Foreign Application Priority Data

Aug. 6, 2020 (DE) .......................... 102020120803.0

(51) Int. Cl.
*G01R 33/07* (2006.01)
(52) U.S. Cl.
CPC .................................. *G01R 33/077* (2013.01)
(58) Field of Classification Search
CPC .............. G01R 33/007; G01R 33/0082; G01R 33/07–077; G01D 5/12; G01D 5/14–147
See application file for complete search history.

(56) References Cited

U.S. PATENT DOCUMENTS

| | | | |
|---|---|---|---|
| 5,548,151 A | * | 8/1996 | Funaki .................. H01L 43/065 257/515 |
| 6,278,271 B1 | | 8/2001 | Schott |

(Continued)

FOREIGN PATENT DOCUMENTS

DE 69513316 T2 12/1999

OTHER PUBLICATIONS

Beran, Philip et al., Impact of Contact Misalignment on Magnetic Cross Sensitivity of Integrated Vertical Hall Sensors; IEEE Trans. Magn. vol. 55, No. 1, (2019), Art. 40000904.

(Continued)

*Primary Examiner* — Huy Q Phan
*Assistant Examiner* — David B Frederiksen
(74) *Attorney, Agent, or Firm* — Renner, Kenner, Greive, Bobak, Taylor & Weber

(57) ABSTRACT

The present invention relates to a Hall effect sensor which is integrated in a semiconductor substrate and enables measurement of a magnetic field component. perpendicularly to the surface of the semiconductor substrate. The Hall effect sensor comprises several Hall elements having an electrically conductive semiconductor region which has a straight-line row of electrical measuring and control contacts on an end face on the substrate surface. The Hall elements are designed or can be operated in such manner that they have a sensitivity both to a magnetic field component parallel to and the magnetic field component perpendicular to the substrate surface of the semiconductor substrate (1). Several of the Hall elements are arranged such that their sensitivity to a magnetic field component parallel to the substrate surface of the semiconductor substrate can be compensated mutually by circuitry or in a signal evaluation. In this way, a sensitivity of these Hall elements to the magnetic field component perpendicular to the substrate surface of the (Continued)

semiconductor substrate is obtained. By using these Hall elements for measuring the magnetic field component perpendicularly to the substrate surface, a very low sensitivity to mechanical stresses can be achieved.

14 Claims, 5 Drawing Sheets

(56) References Cited

U.S. PATENT DOCUMENTS

| | | | | |
|---|---|---|---|---|
| 2009/0256559 A1* | 10/2009 | Ausserlechner | ..... | G01R 33/075 257/E29.323 |
| 2012/0212216 A1* | 8/2012 | Stahl-Offergeld | ... | G01R 33/077 324/251 |
| 2014/0225597 A1* | 8/2014 | Romero | ............... | G01R 33/007 324/207.12 |
| 2016/0146906 A1* | 5/2016 | Suzuki | ................. | G01R 33/072 257/424 |
| 2017/0261306 A1* | 9/2017 | Ausserlechner | ......... | G01B 7/18 |
| 2018/0238938 A1* | 8/2018 | Feucht | ................. | G01R 35/005 |
| 2020/0341078 A1* | 10/2020 | Ausserlechner | ... | G01R 33/0029 |

OTHER PUBLICATIONS

Banjevic, Mirjam et al., On Performance of Series Connected CMOS Vertical Hall Devices; Proc. 26th Intern. Conf. Microelectronics (MIEL 2008), 2008, pp. 337-340—ISSN 978-1-4244-1882-4.

English Translation of German Examination Report received in counterpart German patent application (priority application).

* cited by examiner

HALL SENSOR WITH HALL ELEMENTS MEASURING MAGNETIC FIELD COMPONENTS PERPENDICULARLY TO THE SUBSTRATE SURFACE

TECHNICAL FIELD

The present invention relates to a Hall effect sensor which is integrated in a semiconductor substrate and enables measurement of a magnetic field component perpendicularly to the surface of the semiconductor substrate.

Lateral Hall effect sensors integrated in the substrate are often used for measuring magnetic field components perpendicularly to the substrate surface. Lateral Hall effect sensors have an electrically conductive semiconductor region in the semiconductor substrate, wherein the electrical contacts are arranged on the side edges of the end face of the semiconductor region. Lateral Hall effect sensors are highly sensitive to mechanical stresses in the substrate. These stresses cause an offset and sensitivity drift due to piezoresistive effects and the piezo-Hall effect. Although the stress-induced offset can be neutralised effectively by spin-current operation, the same is not true for stress-induced sensitivity drift. One particularly large problem in this context is posed by the soldering process in the production of the Hall effect sensors, as the mechanical stresses are created by this soldering process and consequently also significantly change the sensitivity of the Hall effect sensors to the magnetic fields that are to be measured. But in subsequent operation as well, mechanical stresses give rise to an undesirable sensitivity drift due to temperature, moisture or other influences.

The influence of the soldering process can be compensated for by re-calibrating the Hall effect sensors after they have been soldered. However, it is difficult to compensate for this influence in subsequent operation. Attempts have been made to address this situation with integrated coils for carrying out a calibration under operational conditions. However, such approaches are still subject to the risk that external interference fields may distort the measurement and thus also the sensitivity correction based thereon.

The problem addressed by the present invention consists in providing a Hall effect sensor integrated in a semiconductor substrate for measuring the magnetic field component perpendicularly to the substrate surface, which is significantly less sensitive to mechanical stresses.

SUMMARY OF THE INVENTION

The problem is solved with the Hall effect sensor according to claim 1. Advantageous variants of the Hall effect sensor are the objects of the dependent claims or may be discerned from the following description and the exemplary embodiments.

The suggested Hall effect sensor includes several Hall elements with an electrically conductive semiconductor region in the semiconductor substrate, wherein the electrical measuring and control contacts of the Hall elements are arranged on the substrate surface in a (straight-line) row on the end face of the semiconductor region. The Hall effect sensor is characterized in that the Hall elements may be designed or operated in such manner that they exhibit sensitivity not only to a magnetic field component parallel to the substrate surface but also to the magnetic field component perpendicular to the substrate surface of the semiconductor substrate, and that multiple Hall elements are arranged such that the sensitivity of these Hall elements to the magnetic field component parallel to the substrate surface of the semiconductor substrate can be compensated mutually by suitable circuitry or in a signal evaluation. The sensitivity of the Hall elements to the magnetic field component perpendicularly to the substrate surface of the semdconductor substrate is preferably obtained in that the electrical contacts have been or are arranged on the end face of the semiconductor region with an offset relative to an axis of symmetry of the end face. Ac the same time, the straight-line row of contacts is preferably shifted or offset parallel to the axis of symmetry of the end face.

In this context, the semiconductor region of each of the Hall elements may be of the same design as that of known lateral Hall effect sensors or vertical Hall effect sensors, although each of the electrical contacts are in a different arrangement or position. However, the semiconductor regions are preferably of the same design as that of vertical Hall effect sensors or Hall elements. In vertical Hall elements, the electrically conductive semiconductor regions extend into the semiconductor substrate perpendicularly to the substrate surface, and the electrical contacts are arranged in a row on an axis of symmetry of the end face. In this context, the suggested Hall effect sensor preferably has two vertical Hall elements (or a multiple thereof), in which the row of electrical contacts is arranged correspondingly with an offset with respect to the axis of symmetry of the end face. In the following description, these Hall elements will therefore be described as modified vertical Hall elements. As a result of this modification, the vertical Hall elements have sensitivity not only to a magnetic field component parallel to the substrate surface but also to a magnetic field component perpendicularly to the substrate surface of the semiconductor substrate. The magnetic field component perpendicular to the substrate surface can be determined by suitable arrangement and wiring of the Hall elements of each pair or by suitable arrangement and evaluation of the measurement signals of the Hall elements of each pair.

There are also other options instead of the electrical contacts offset with respect to the axis of symmetry for achieving the (cross-) sensitivity to the magnetic field component perpendicularly to the substrate surface. Thus for example, the option exists to apply an electrical voltage across the row of measuring and control contacts via two metallisations additionally applied parallel to the row of measuring and control contacts during operation of the Hall effect sensor. A further option is to implant additional, differently doped wells on both sides of the straight-line row of electrical measuring and control contacts. A slanted implantation of the electrically conductive semiconductor region (instead of the vertical implantation employed with vertical Hall effect sensor or Hall elements) also results in the intended cross-sensitivity. Of course, this is not an exhaustive list of the possibilities for achieving the cross-sensitivity intended here with vertical Hall effect sensors.

By using correspondingly modified vertical Hall elements—or generally Hall elements with a straight-line row of electrical contacts—it is possible to achieve significantly less sensitivity of this Hall effect sensor to mechanical stresses than is the case with known lateral Hall effect sensors. Vertical Hall elements have all contacts in one (straight-line) row, so they are resistant to mechanical stresses. With the change of position of this row of contacts relative to the axis or symmetry and/or the centre axis of the front face, or other modifications, the sensitivity of the vertical Hall elements to a magnetic field component perpendicularly to the semiconductor surface is obtained. Thus, the suggested Hall effect sensor can replace known lateral Hall effect sensors. In the variant with the shifted contacts, the sensitivity of the Hall effect sensor to the magnetic field component perpendicularly to the semiconductor surface increases as the row of electrical contacts is shifted farther from the axis of symmetry towards the edge of the end face.

In the suggested Hall effect sensor, two of the modified vertical Hall elements are preferably each rotated through 180° with respect to each other about an axis perpendicular to the substrate surface. In the variant with the shifted contacts, Hall elements are then arranged parallel to each other in such manner that the electrical contacts of the Hall elements are offset in opposite directions with respect to the axis of symmetry of the respective end face. The two Hall elements of this pair can then be wired so that this pair only delivers a measurement signal for the magnetic field component perpendicular to the substrate surface of the semiconductor substrate. Several such pairs may also be present in the Hall effect sensor, and they do not have to be arranged parallel to each other.

In a further advantageous variant, the suggested Hall effect sensor includes at least one pair of the modified vertical Hall elements, which are rotated with respect to each other through 180° about an axis perpendicular to the substrate surface and/or are arranged parallel to each other, and of which the contacts are shifted in opposite directions with respect to the axis of symmetry of the end face. In this variant, the two Hall elements in each pair are wired to each other variably in such manner that in a first switching state the pair is only sensitive to the magnetic field component perpendicularly to the substrate surface of the semiconductor substrate—and so delivers a signal—, and in a second switching state it is only sensitive to and delivers a signal for a magnetic field component parallel to the substrate surface of the semiconductor substrate. For this purpose, the circuitry is designed with corresponding switching elements for switching between the first and the second switching state. With this Hall effect sensor, switching from one switching state to the other thus makes it possible to detect different magnetic field components.

The individual Hall elements of the Hall effect sensor do not necessarily have to be connected or wired to each other as described above. It is also possible to operate the Hall elements singly and then calculate their measurement signals together in such a way that the desired magnetic field component is detected and measured. In this context, the modified Hall elements may have to be arranged in a manner that is suitable for the different sensitivity directions.

With the suggested Hall effect sensor, for the first time stress-resistant measurements can be taken of the magnetic field component perpendicularly to the substrate surface, which were previously not possible with the known lateral Hall effect sensors. By using the same type of Hall elements for all sensor components, a better synchronisation is achieved in terms of temperature drifts, so that correction parameters are valid for all sensor components. Of course, besides the modified Hall elements the Hall effect sensor can also include one or more unmodified vertical Hall elements as well for measuring the magnetic field components parallel to the substrate surface.

BRIEF DESCRIPTION OF THE DRAWING

In the following text, the suggested Hall effect sensor will be explained again, in greater detail, with reference to exemplary embodiments and in conjunction with the drawing. In the drawing.

WAYS TO IMPLEMENT THE INVENTION

The suggested Hall effect sensor includes multiple Hall elements in which the electrical measuring and control contacts are arranged in a row on the substrate surface on the end face of the semiconductor region, and which have been modified in such manner that the Hall elements also exhibit cross-sensitivity to a magnetic field component perpendicularly to the substrate surface of the semiconductor substrate. This will be explained in the following text, first with reference to an exemplary modification in which the electrical contacts arranged in a row are shifted and/or arranged with an offset relative to the axis of symmetry of the end face.

Figure 1:
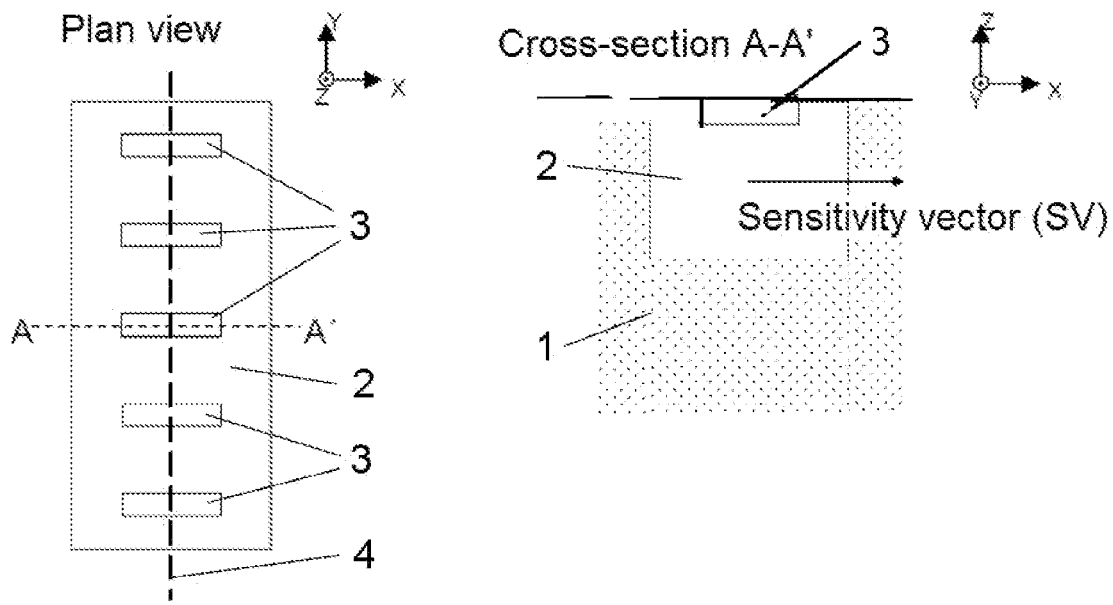
FIG. 1 shows a plan view and cross sectional view of a vertical Hall element according to the prior art.

All of the electrical contacts on known vertical Hall elements are arranged in a row, which renders them resistant to mechanical stresses. The contacts 3 (measuring and control contacts) are constructed on the end face of the electrically conductive semiconductor region 2 of the Hall element, which extends perpendicularly into the semiconductor substrate 1. In this context, the row of electrical contacts 3 is positioned symmetrically on the axis of symmetry 4 of the end face, as is illustrated in FIG. 1, in the plan view of a vertical Hall element according to the prior art. However, vertical Hall elements of such kind are only able to measure magnetic fields or magnetic field components parallel to the surface of the semiconductor substrate 1. This is represented in cross-section A-A' in FIG. 1, which indicates the sensitivity vector SV for such a vertical Hall element.

In contrast, the suggested Hall effect sensor is equipped with modified vertical Hall elements which are represented for exemplary purposes in FIG. 2 and are used in the following examples. The modification consists in shifting the electrical contacts 3 on the end face of the electrically conductive semiconductor regions 2 laterally relative to the axis of symmetry 4, as may be seen in the plan view in FIG. 2. Shifting or offsetting these contacts 3 renders the vertical Hall elements transversely sensitive to magnetic fields perpendicular to the surface of the semiconductor substrate 1. This is indicated with the sensitivity vector SV in the cross-section A-A' in FIG. 2. This resulting sensitivity vector SV is directed in both the x and z directions, and thus has components SVx and SVz. Through the use and suitable wiring or also suitable evaluation of the measurement signals from these modified vertical Hall elements, magnetic fields perpendicular to the surface of the semiconductor substrate can be detected, so that in turn known lateral Hall effect sensors may be replaced with the suggested Hall effect sensor.

Figure 3:
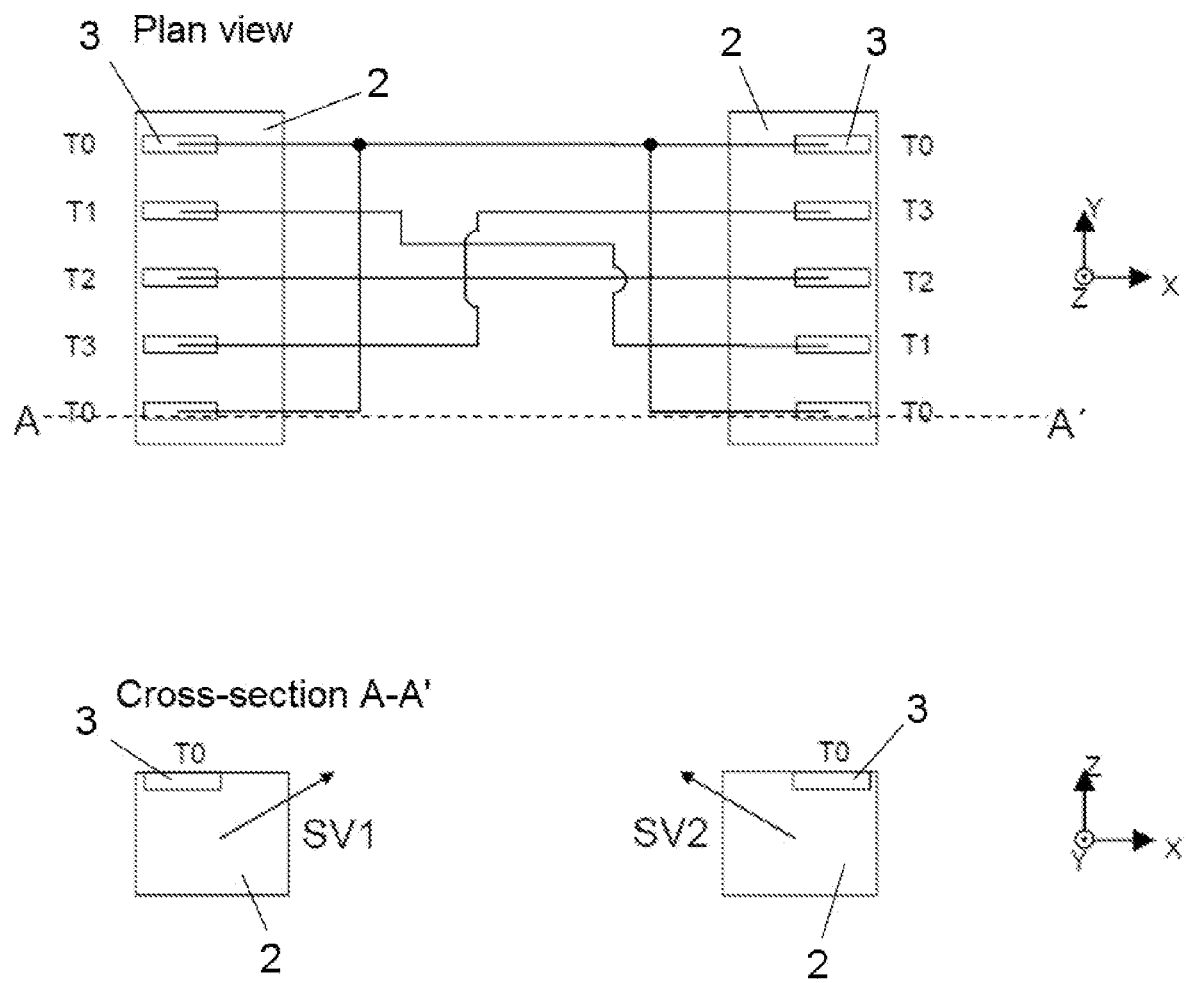
FIG. 3 shows a plan view and cross sectional view of two modified vertical Hall elements which are wired to each other according to an exemplary variant of the suggested Hall effect sensor.

An example of a suitable circuit arrangement is represented in FIG. 3. In this context, two of the modified vertical Hall elements are arranged parallel to each other such that the contacts 3 of the respective Hall elements are shifted in opposite directions relative to the respective axis of symmetry of the end face. This may be discerned in the plan view as well as in the cross-section representation of FIG. 3. These two Hall elements may be wired to each other in such a way that the parallel magnetic field components $SV1x$ and $SV2x$ are compensated. Consequently, therefore, only the component of the sensitivity vector which is sensitive to magnetic fields perpendicularly to the substrate surface ($Sv1z$ and $SV2z$) remains. A corresponding circuit arrangement in which the electrical contacts T1 and T3 of the oppositely positioned Hall elements are connected to each other crosswise is shown in the plan view of FIG. 3. Again, the cross-sectional representation of FIG. 3 again shows the sensitivity vectors SV1 and SV2 of the parallel opposing Hall elements.

Figure 4:
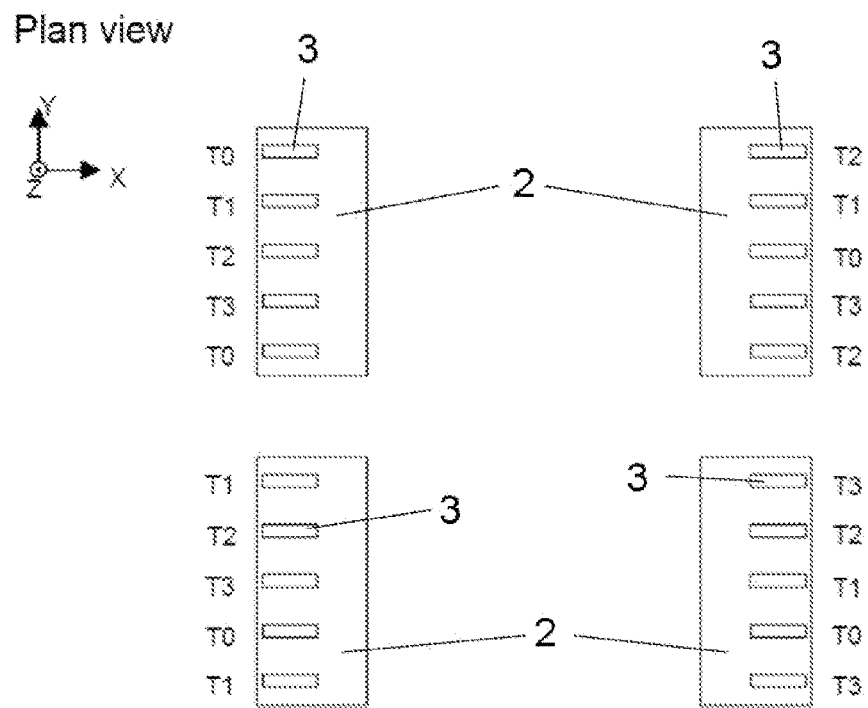
FIG. 4 shows a plan view of an exemplary arrangement of modified vertical Hall elements in the suggested Hall effect sensor.
Figure 5:
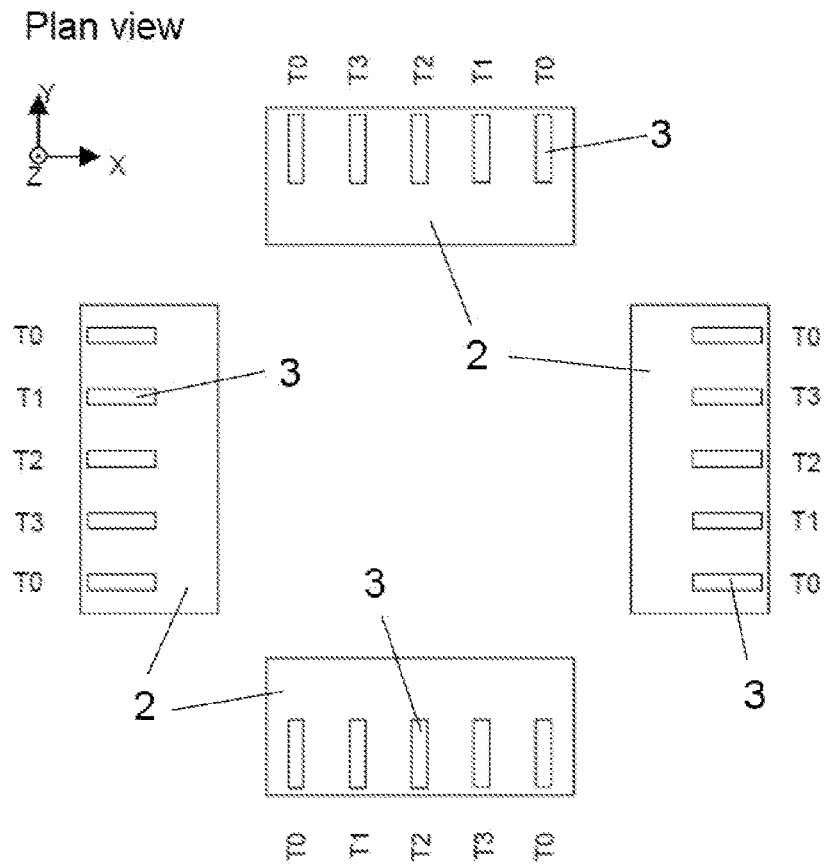
FIG. 5 shows a plan view of an exemplary arrangement of modified vertical Hall elements in the suggested Hall effect sensor.

The suggested Hall effect sensor may also consist of more than two modified vertical Hall elements. Examples of this are represented in FIGS. 4 and 5. In the variant of FIG. 4, all modified Hall elements are positioned parallel to each other, wherein in this case an offset compensation method, referred to as "forced symmetrisation" is used. This is made evident by the designation of the contacts T0 to T3 in the four Hall elements of FIG. 4. All contacts with the same designation are interconnected with each other.

In the variant of FIG. 5, two pairs of Hall elements are formed, extending perpendicularly to each other. In this way, a sensitivity (and thus also measurement capability) is enabled for magnetic field components in the x direction and the y direction.

Figure 6:
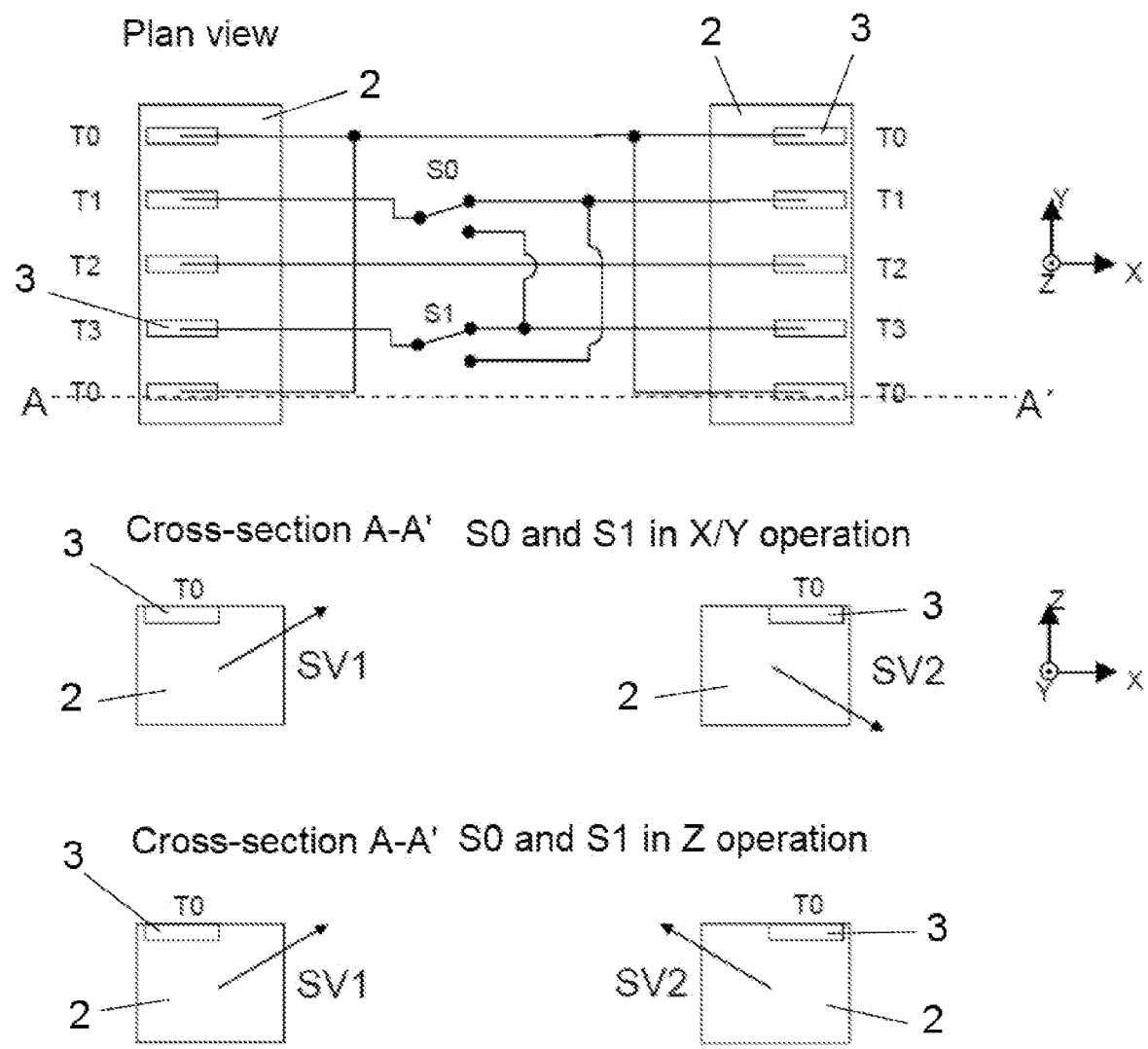
FIG. 6 shows a plan view and two cross-sectional views of an exemplary arrangement and wiring of modified vertical Hall elements in the suggested Hall effect sensor.

The Hall elements may also be connected variably, so that the suggested Hall effect sensor can be operated both as a lateral sensor and as a vertical sensor. An example of wiring for two parallel modified vertical Hall elements is shown in the plan view in FIG. 6. The circuit includes two switching elements S0 and S1, with which it is possible to switch between two switching states. In one switching state, the parallel magnetic field components $SV1x$ and $SV2x$ compensate each other as in the variant of FIG. 3. In the second switching state, the components $SV1z$ and $SV2z$ cancel each other out, with the result that only $SV1x$ and $SV2x$ remain. Depending on the switching state, the Hall effect sensor is thus sensitive either for the vertical magnetic field component or for a horizontal magnetic field component. The two cross-sectional representations show both Hall effect sensor elements with the corresponding sensitivity vectors in the two switching states of switches S0 and S1.

Figure 7:
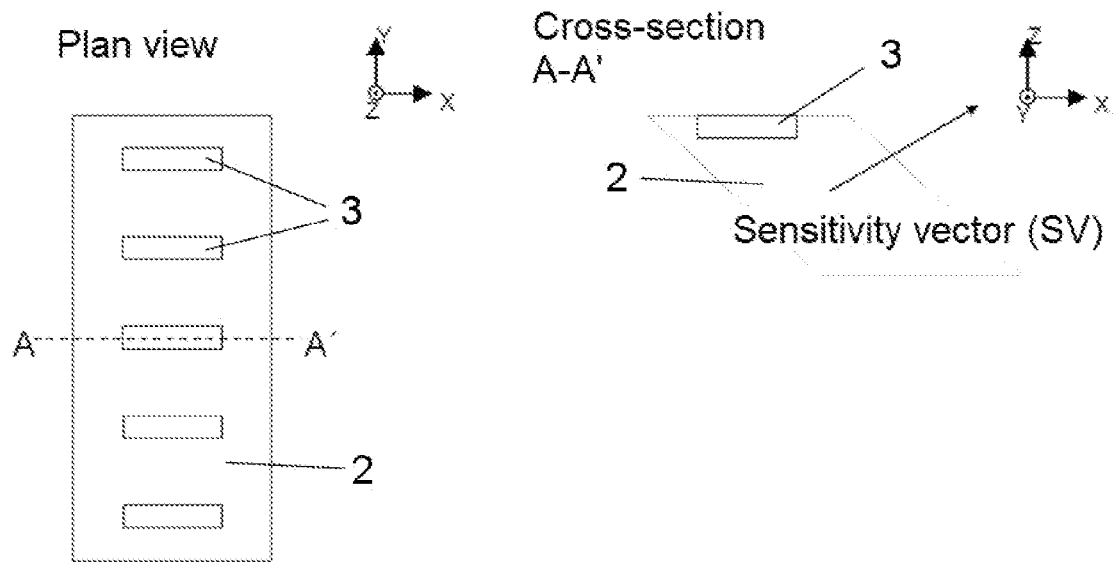
FIG. 7 shows a plan view and cross-sectional view of a further example of a modified vertical Hall element such as may be used in the suggested Hall effect sensor.

FIG. 7 shows a further example of a modified vertical Hall element such as may be used in the suggested Hall effect sensor. In this example, the modification consists of creating the electrically conductive semiconductor region 2 by slanted implantation in such manner that it does not extend perpendicularly but at an angle≠ 90° to the surface, as is discernible in the cross-section representation on the right in FIG. 7. Because of its slanted disposition, this vertical Hall element is transversely sensitive to magnetic fields perpendicularly to the surface of the semiconductor substrate. This is indicated in the cross-section A-A' of FIG. 7 by the sensitivity vector SV. This resulting sensitivity vector SV is directed both in the x direction and in the z direction and so includes components SVx and SVz.

Figure 8:
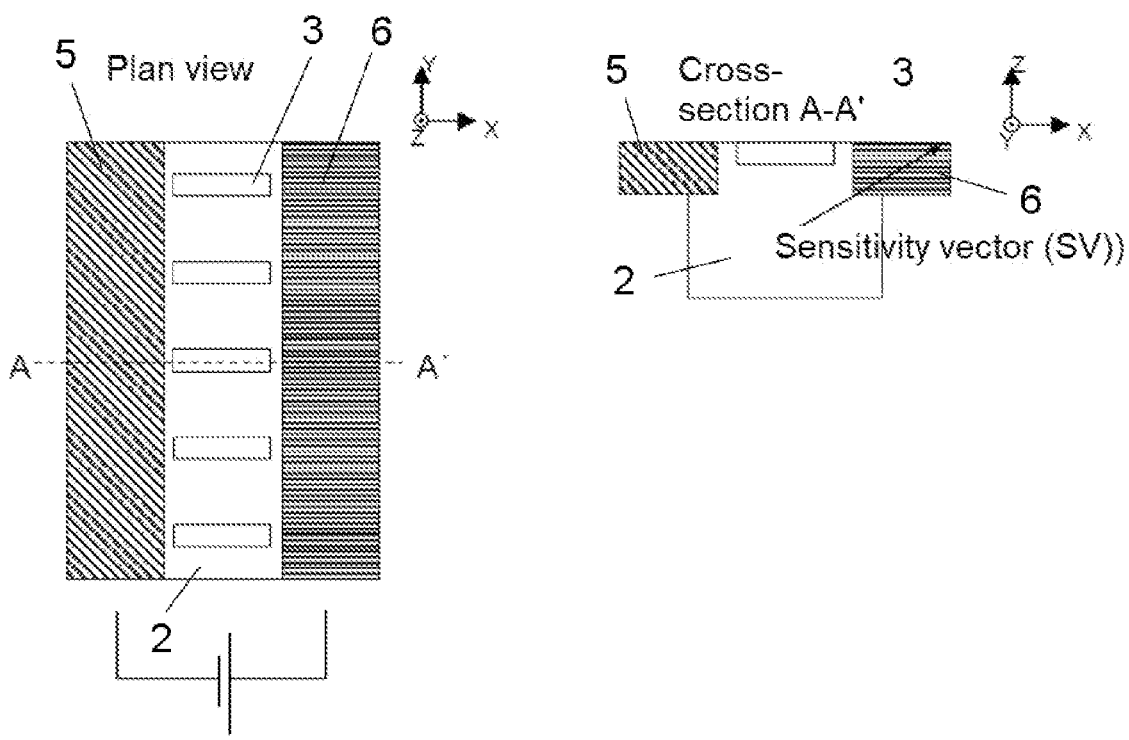
FIG. 8 shows a plan view and cross-sectional view of a further example of a modified vertical Hall element such as may be used in the suggested Hall effect sensor.

FIG. 8 shows a further example of a modified vertical Hall element such as may be used in the suggested Hall effect sensor. In this example, the modification consists in implanting differently doped wells 5, 6 on either side of the row of electrical contacts 3 on the end face of the electrically conductive semiconductor regions, as may be seen in both the plan view and the cross-section view in FIG. 8. These differently doped additional wells serve to make the vertical Hall elements sensitive to magnetic fields perpendicularly to the surface of the semiconductor substrate. This is indicated in the cross-section A-A' in FIG. 8 with the sensitivity vector SV. This resulting sensitivity vector SV is directed in both the x direction and in the z direction and so includes components SVx and SVz.

Instead of the differently doped wells of FIG. 8, it is also possible to arrange two highly doped polysilicon regions or metallisations on either side of the row of electrical contacts 3 and insulated therefrom. When an electrical voltage is applied between the two highly doped polysilicon regions or metallisations, the vertical Hall elements also become transversely sensitive to magnetic fields perpendicularly to the surface of the semiconductor substrate.

Figure 2:
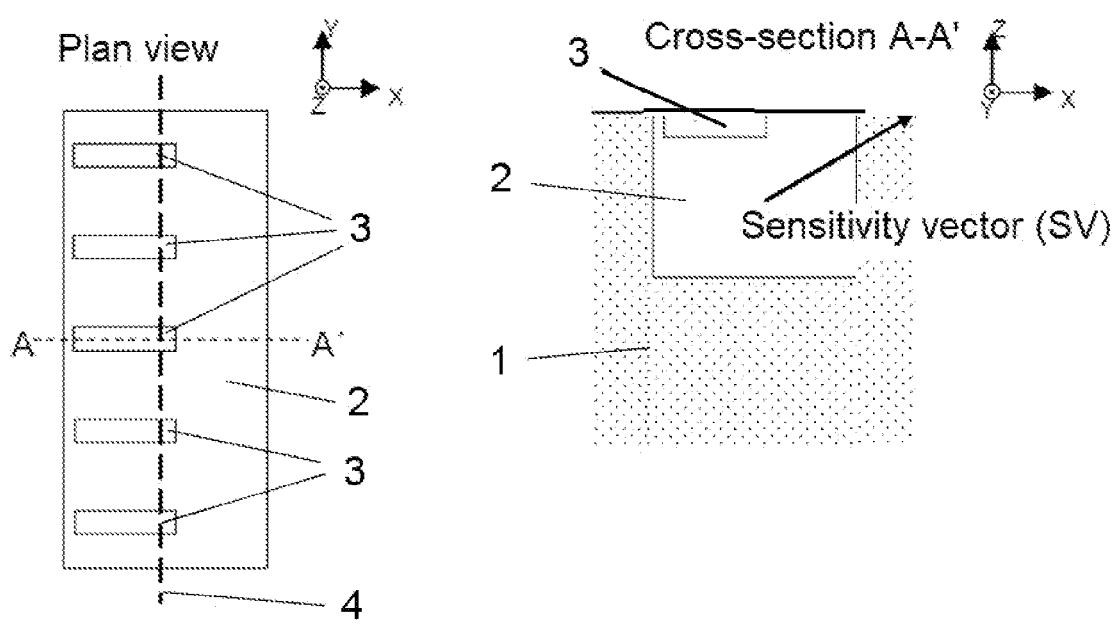
FIG. 2 shows a plan view and cross sectional view of a modified vertical Hall element, such as may be used in the suggested Hall effect sensor.

Through the use and suitable wiring or also the suitable evaluation of the measurement signals from these modified vertical Hall elements of FIGS. 7 and 8, as in the variant of FIG. 2 magnetic fields can be detected perpendicularly to the surface of the semiconductor substrate, with the result that known lateral Hall effect sensors can be replaced with the suggested Hall effect sensor. The circuitry may be configured in the same way as the variants of FIGS. 3 to 6.

In the exemplary embodiments presented, the Hall effect sensor was explained with reference to Hall elements having five contacts, also referred to as vertical 5-pin Hall elements. However, this should be considered only as an example for explanatory purposes. The Hall effect sensor may be created with any number of electrical contacts suitable for operating Hall elements arranged in a straight-line row on the Hall element.

The suggested Hall effect sensor may also be created without the circuitry connecting the Hall elements as described above. The measurement signals from the individual Hall elements may also be recorded singly and then calculated appropriately by digital means. For this purpose, the individual hall elements only have to have the different sensitivity directions as indicated in FIG. 3. All of the variants described in the exemplary embodiments may also be realized in this way. The use of just a single Hall element is also possible, provided it exhibits negligible sensitivity for magnetic field components parallel to the substrate surface due to the offset of the electrical contacts or another modification for the measurement.

LIST OF REFERENCE SIGNS

1 Semiconductor substrate
2 Electrically conductive semiconductor region
3 Electrical contact
4 Axis of symmetry
5 Doped well
6 Doped well S0 Switch
S1 Switch
SV Sensitivity vector

The invention claimed is:

1. A Hall effect sensor which is integrated in a semiconductor substrate (1) and enables a measurement of a magnetic field component perpendicularly to a substrate surface of the semiconductor substrate (1),
wherein the Hall effect sensor is equipped with multiple Hall elements having an electrically conductive semiconductor region (2) in the semiconductor substrate (1), which has a straight-line row of electrical measuring and control contacts (3) on an end face on the substrate surface,
characterized in that the Hall elements are vertical Hall elements, which are designed and operated in such manner that they have a sensitivity both to a magnetic field component parallel to and the magnetic field component perpendicular to the substrate surface of the semiconductor substrate (1), and several of the Hall elements are arranged such that their sensitivity to the magnetic field component parallel to the substrate surface of the semiconductor substrate is compensated mutually by circuitry or in a signal evaluation.

2. The Hall effect sensor according to claim 1, characterized in that
the Hall elements are constructed such that their sensitivity to the magnetic field component parallel to the substrate surface results in an opposite Hall voltage at the electrical measuring contacts (3) when the Hall elements are rotated through 180° about an axis perpendicular to the substrate surface.

3. The Hall effect sensor according to claim 2, characterized in that
two of the Hall elements are each constructed identically and are arranged in rotation through 180° about an axis perpendicular to the substrate surface relative to each other.

4. The Hall effect sensor according to claim 3, characterized in that
the electrical measuring contacts (3) of the respective two Hall elements are cross-connected to each other.

5. The Hall effect sensor according to claim 1, characterized in that
the electrical measuring and control contacts (3) on the end face of the electrically conductive semiconductor region (2) are arranged on the end face with offset relative to an axis of symmetry (4) of the end face.

6. The Hall effect sensor according to claim 1, characterized in that
the electrically conductive semiconductor regions (2) extend into the semiconductor substrate (1) perpendicularly to the substrate surface.

7. The Hall effect sensor according to claim 6, characterized in that
the Hall effect sensor includes a pair of the Hall elements in which the Hall elements are arranged parallel to each other, and the electrical measuring and control contacts (3) of the Hall elements are arranged with offset in opposite directions with respect to the axis of symmetry (4) of the end face.

8. The Hall effect sensor according to claim 6, characterized in that
the Hall effect sensor includes several pairs of the Hall elements in which the Hall elements are arranged parallel to each other, and the electrical measuring and control contacts (3) of the Hall elements are arranged with offset in opposite directions with respect to the axis of symmetry (4) of the end face.

9. The Hall effect sensor according to claim 1, characterized in that
the electrically conductive semiconductor regions (2) extend into the semiconductor substrate at an angle≠ 90° relative to the substrate surface (1).

10. The Hall effect sensor according to claim 1, characterized in that
the Hall elements include differently doped wells arranged on either side of the straight-line row of electrical measuring and control contacts (3), by means of which wells the sensitivity of the Hall elements to the magnetic field component perpendicular to the substrate surface of the semiconductor substrate (1) is achieved.

11. The Hall effect sensor according to claim 1, characterized in that
the Hall elements are connected by circuitry in such a manner to form one or more groups, that due to the circuitry the respective group only delivers a measurement signal for the magnetic field component perpendicularly to the substrate surface of the semiconductor substrate (1).

12. The Hall effect sensor according to claim 1, characterized in that
the Hall elements are variably connected by circuitry to form one or more groups in such manner that in a first switching state the respective group only delivers a measurement signal for the magnetic field component perpendicularly to the substrate surface of the semiconductor substrate (1), and in a second switching state the group only delivers a measurement signal for the magnetic field component parallel to the substrate surface of the semiconductor substrate (1).

13. The Hall effect sensor according to claim 1, characterized in that
the Hall elements and/or one or more groups formed by connection of the Hall elements are connected to an evaluation device which evaluates measurement signals from the Hall elements and/or groups in such manner that at least the magnetic field ¬component perpendicular to the substrate surface of the semiconductor substrate (1) is determined.

14. The Hall effect sensor according to claim 1, characterized in that
at least two of the Hall elements are not arranged parallel to each other.

* * * * *